(12) United States Patent
Niwano

(10) Patent No.: US 10,481,422 B2
(45) Date of Patent: Nov. 19, 2019

(54) LASER DEVICE AND EXTREME ULTRAVIOLET LIGHT GENERATION DEVICE

(71) Applicant: Gigaphoton Inc., Tochigi (JP)

(72) Inventor: Motoki Niwano, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/377,412

(22) Filed: Apr. 8, 2019

(65) Prior Publication Data

US 2019/0235287 A1 Aug. 1, 2019

Related U.S. Application Data

(63) Continuation of application No. PCT/JP2016/084345, filed on Nov. 18, 2016.

(51) Int. Cl.
| | |
|---|---|
| *G02F 1/03* | (2006.01) |
| *H05G 2/00* | (2006.01) |
| *H01S 3/10* | (2006.01) |
| *G03F 7/20* | (2006.01) |

(52) U.S. Cl.
CPC .............. *G02F 1/0305* (2013.01); *H01S 3/10* (2013.01); *H05G 2/005* (2013.01); *H05G 2/006* (2013.01); *H05G 2/008* (2013.01); *G03F 7/70033* (2013.01)

(58) Field of Classification Search
USPC ....................................................... 250/504 R
See application file for complete search history.

(56) References Cited

U.S. PATENT DOCUMENTS

2007/0263677 A1 11/2007 Tanaka et al.
2013/0032735 A1* 2/2013 Nowak ................. H01S 3/0085
250/504 R
(Continued)

FOREIGN PATENT DOCUMENTS

JP H05-005912 A 1/1993
JP H06-334276 A 12/1994
(Continued)

OTHER PUBLICATIONS

International Search Report issued in PCT/JP2016/084345; dated Feb. 7, 2017.
(Continued)

*Primary Examiner* — Kiet T Nguyen
(74) *Attorney, Agent, or Firm* — Studebaker & Brackett PC

(57) ABSTRACT

A laser device includes: a plurality of optical shutters (61, 62); a power source device (303*n*) configured to generate high voltage to be applied to the optical shutters (61, 62); a high-voltage side wire (63*h*) connecting the power source device (303*n*) and each of the optical shutters (61, 62); a ground-side wire (63*g*) grounding each of the optical shutters (61, 62); and a high-voltage side shared wire (64*h*) and a ground-side shared wire (64*g*) connecting the optical shutters (61, 62) in parallel. One of the high-voltage side wire (63*h*) and the ground-side wire (63*g*) is connected with the optical shutter (61) disposed on the most upstream side in the traveling direction of the laser beam, and the other of the high-voltage side wire (63*h*) and the ground-side wire (63*g*) is connected with the optical shutter (62) disposed on the most downstream side in the traveling direction of the laser beam.

16 Claims, 9 Drawing Sheets

(56) References Cited

U.S. PATENT DOCUMENTS

| | | | |
|---|---|---|---|
| 2013/0094529 A1* | 4/2013 | Wakabayashi | H01S 3/0057 372/27 |
| 2015/0189730 A1 | 7/2015 | Moriya et al. | |
| 2016/0066401 A1* | 3/2016 | Yabu | H05G 2/006 250/504 R |
| 2016/0087389 A1 | 3/2016 | Niwano et al. | |
| 2017/0181259 A1 | 6/2017 | Nogiwa | |

FOREIGN PATENT DOCUMENTS

| | | |
|---|---|---|
| JP | 2002-093941 A | 3/2002 |
| JP | 2007-139494 A | 6/2007 |
| JP | 2009-224631 A | 10/2009 |
| JP | 4730898 B2 | 7/2011 |
| JP | 2013-065804 A | 4/2013 |
| WO | 2006/114842 A1 | 11/2006 |
| WO | 2014/042003 A1 | 3/2014 |
| WO | 2015/012099 A1 | 1/2015 |
| WO | 2016/067343 A1 | 5/2016 |

OTHER PUBLICATIONS

International Preliminary Report on Patentability and Written Opinion issued in PCT/JP2016/084345; dated May 21, 2019.

* cited by examiner

LASER DEVICE AND EXTREME ULTRAVIOLET LIGHT GENERATION DEVICE

CROSS-REFERENCE TO RELATED APPLICATIONS

The present application is a continuation application of International Application No. PCT/JP2016/084345 filed on Nov. 18, 2016. The content of the application is incorporated herein by reference in its entirety.

BACKGROUND

1. Technical Field

The present disclosure relates to a laser device and an extreme ultraviolet light generation device including the laser device.

2. Related Art

Recently, refinement of a transfer pattern in optical lithography of a semiconductor process has been rapidly proceeding along with refinement of the semiconductor process. Minute fabrication at 20 nm or smaller will be requested in the next generation technology. Thus, it is desired to develop an exposure device including an extreme ultraviolet (EUV) light generation device configured to generate extreme ultraviolet (EUV) light at a wavelength of 13 nm approximately in combination with reduced projection reflective optics.

Disclosed EUV light generation devices include the three kinds of devices of a laser produced plasma (LPP) device that uses plasma generated by irradiating a target with a laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: International Patent Publication No. 2014/042003
Patent Document 2: Japanese Patent No. 4730898
Patent Document 3: Japanese Unexamined Patent Application Publication No. 2002-093941
Patent Document 4: Japanese Unexamined Patent Application Publication No. 2009-224631

SUMMARY

A laser device according to an aspect of the present disclosure includes: a plurality of optical shutters disposed in series with each other on an optical path of a laser beam and configured to open and close in response to application of high voltage; a power source device configured to generate the high voltage to be applied to the optical shutters; a high-voltage side wire connecting the power source device and each optical shutter; a ground-side wire grounding each optical shutter; and a high-voltage side shared wire and a ground-side shared wire electrically connecting the optical shutters in parallel with each other, one of the high-voltage side wire and the ground-side wire being connected with an optical shutter disposed on the most upstream side in the traveling direction of the laser beam among the optical shutters, and the other of the high-voltage side wire and the ground-side wire being connected with an optical shutter disposed on the most downstream side in the traveling direction of the laser beam among the optical shutters.

BRIEF DESCRIPTION OF THE DRAWINGS

Embodiments of the present disclosure will be described below as examples with reference to the accompanying drawings.

DESCRIPTION OF EMBODIMENTS

Contents

1. Overall description of EUV light generation device
1.1 Configuration
1.2 Operation
2. Comparative example
2.1 Configuration
2.2 Operation
2.3 Problem
3. Embodiment 1
3.1 Configuration of Embodiment 1
3.2 Operation of Embodiment 1
3.3 Effect of Embodiment 1
4. Embodiment 2
4.1 Configuration of Embodiment 2
4.2 Operation of Embodiment 2
4.3 Effect of Embodiment 2
5. Embodiment 3
5.1 Configuration of Embodiment 3
5.2 Operation of Embodiment 3
5.3 Effect of Embodiment 3

6. Embodiment 4
6.1 Configuration of Embodiment 4
6.2 Operation of Embodiment 4
6.3 Effect of Embodiment 4

Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Overall Description of EUV Light Generation Device

1.1 Configuration

Figure 1:
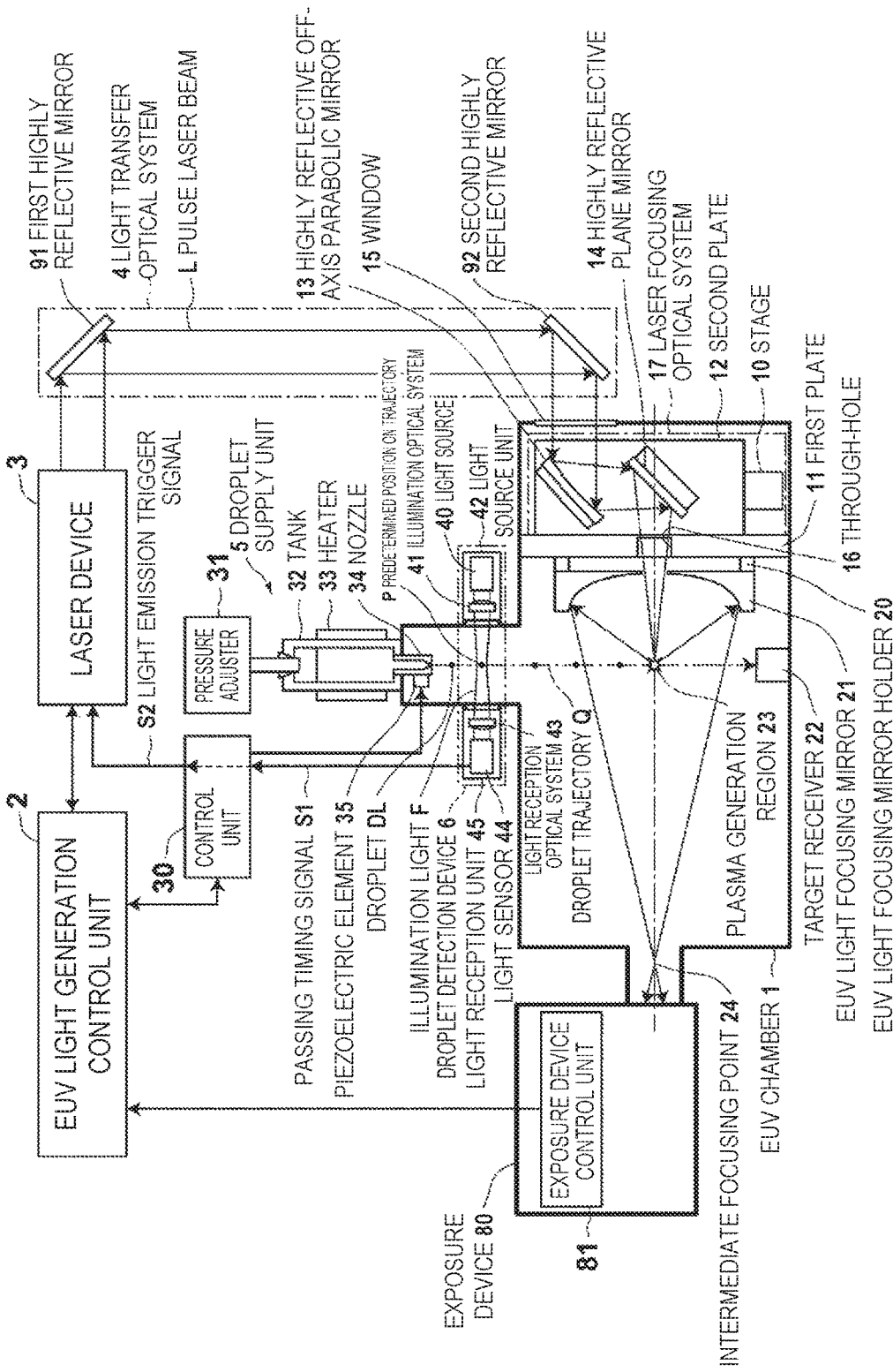
FIG. 1 is a schematic sectional view illustrating the entire configuration of a typical EUV light generation device.

FIG. 1 is a schematic sectional view illustrating the entire configuration of a typical extreme ultraviolet (EUV) light generation device. The EUV light generation device illustrated in FIG. 1 supplies an exposure device 80 with EUV light to be used as exposure light. Specifically, the EUV light generation device is constituted by components other than the exposure device 80 and an exposure device control unit 81 in FIG. 1. The EUV light generation device of the present example employs a laser generation plasma (LPP) scheme in which EUV light is generated by irradiating a target material with a laser beam to excite the target material. This EUV light generation device includes an EUV chamber 1, an EUV light generation control unit 2, a laser device 3, a light transfer optical system (beam delivery system) 4, and a droplet supply unit 5, and a droplet detection device 6.

The EUV chamber 1 is a chamber for generating EUV light therein, and preferably a vacuum chamber. The EUV chamber 1 includes a stage 10, a first plate 11, a second plate 12 held in the EUV chamber 1 through the stage 10, a high reflectance off-axis parabolic mirror 13 held on the second plate 12, a high reflectance plane mirror 14 held on the second plate 12, and a laser beam introduction window 15. The first plate 11 is provided with a laser beam introduction through-hole 16. The high reflectance off-axis parabolic mirror 13 and the high reflectance plane mirror 14 constitute a laser focusing optical system 17 for condensing a pulse laser beam L to be described later.

The EUV chamber 1 further includes an EUV light focusing mirror holder 20, an EUV light focusing mirror 21 held by the EUV light focusing mirror holder 20, and a target receiver 22. The EUV light focusing mirror 21 includes a reflection surface having, for example, a spheroidal surface shape, and is disposed so that the first focal point thereof is positioned in a plasma generation region 23 and the second focal point thereof is positioned at an intermediate focus point (IF) 24.

The laser device 3 generates the pulse laser beam L for exciting a target material. The laser device 3 is, for example, a master oscillator power amplifier type laser apparatus. Alternatively, the laser device 3 may be, for example, a combination of an yttrium aluminum garnet (YAG) laser device configured to generate a pre-pulse laser beam and a $CO_2$ laser device configured to generate a main pulse laser beam. Alternatively, the laser device 3 may be another laser device. The pulse laser beam L output from the laser device 3 has, for example, a pulse width of several ns to several tens ns approximately and a frequency of 10 kHz to 100 kHz approximately.

The light transfer optical system 4 includes a first high reflectance mirror 91 that reflects the pulse laser beam L output from the laser device 3 and changes the traveling direction thereof, and a second high reflectance mirror 92 that reflects, toward the window 15, the pulse laser beam L reflected at the first high reflectance mirror 91.

The droplet supply unit 5 supplies, as a spherical droplet DL into the EUV chamber 1, a target material such as tin (Sn) or lithium (Li) used to generate EUV light. The droplet supply unit 5 includes a control unit 30, a pressure adjuster 31, a tank 32 that stores the target material in a melted state, a heater 33 configured to melt the target material, a nozzle 34 that discharges the target material in the melted state, and a piezoelectric element 35 configured to vibrate the sidewall of the nozzle 34. The droplet DL is intermittently and periodically generated and proceeds on a droplet orbit Q in the EUV chamber 1.

The droplet detection device 6 includes a light source unit 42 including a light source 40 such as a semiconductor laser configured to emit illumination light F having a wavelength, for example, in the visible range, and an illumination optical system 41. The illumination optical system 41 condenses the illumination light F at a predetermined position P on the droplet orbit Q. When the droplet DL is present at the position P, the droplet DL partially blocks the illumination light F. The droplet detection device 6 also includes a light receiving unit 45 including a light receiving optical system 43 configured to condense the illumination light F, and an optical sensor 44 configured to detect the condensed illumination light F. The light receiving unit 45 is disposed facing to the light source unit 42. The illumination optical system 41 includes, for example, a light condensing lens. The illumination light F having emitted from the light source 40 and then passed through the illumination optical system 41 condenses at the position P. The light receiving optical system 43 includes, for example, a light condensing lens. Having condensed at the position P and then diffused, the illumination light F is condensed through the light receiving optical system 43 and incident on the optical sensor 44.

Figure 2:
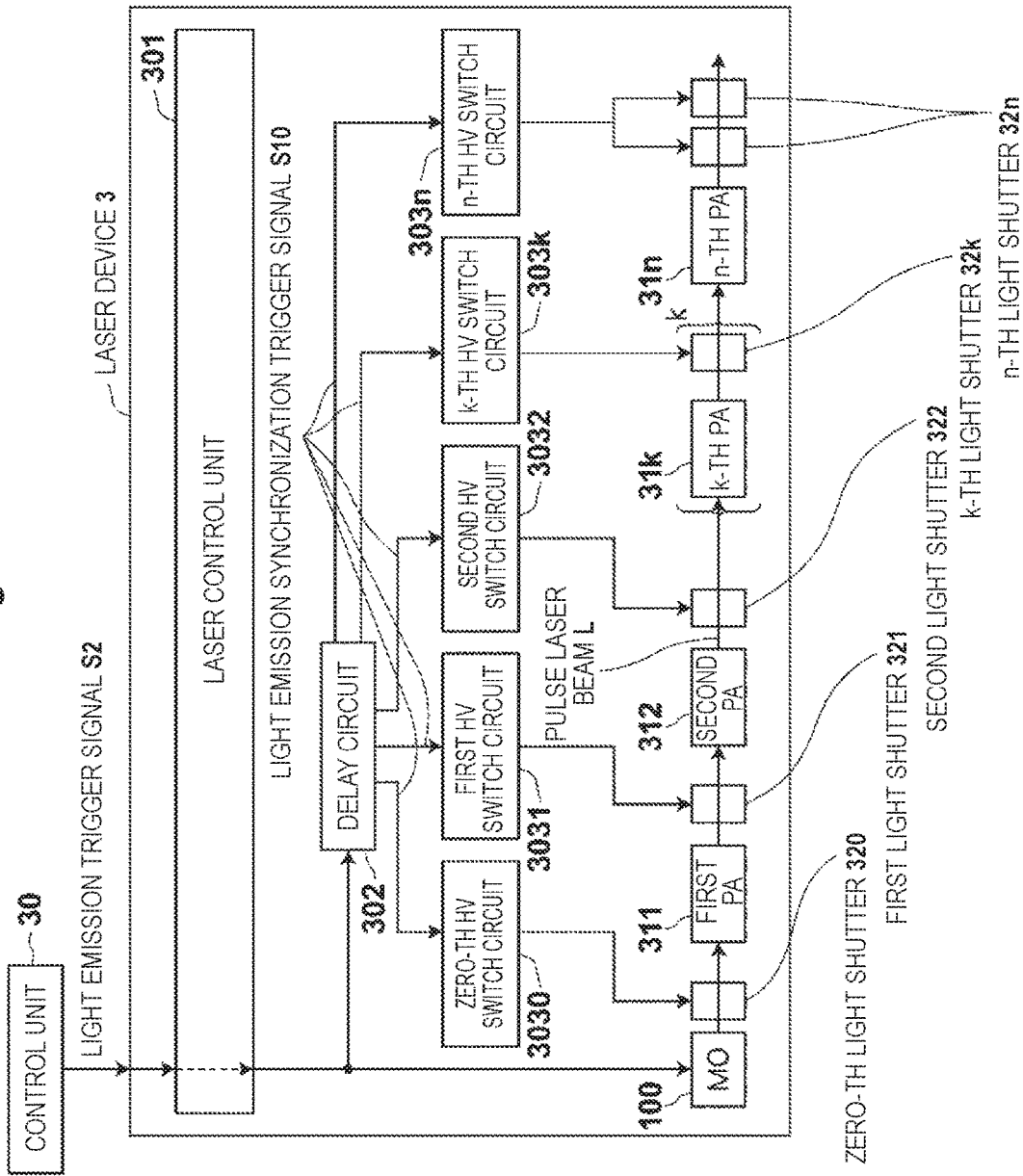
FIG. 2 is a block diagram schematically illustrating a laser device included in the EUV light generation device illustrated in FIG. 1.

FIG. 2 is a block diagram illustrating the basic configuration of the master oscillator power amplifier type laser device 3. The laser device 3 includes a master oscillator 100 configured to emit a pulse laser beam, n amplifiers 311, 312, ..., 31k, ..., and 31n configured to sequentially amplify the laser beam, and (n+2) optical shutters 320, 321, 322, ..., 32k, ..., 32n, and 32n. The laser device 3 further includes a laser control unit 301, a delay circuit 302, the operation of which is controlled by the laser control unit 301, and (n+1) high voltage switch circuits 3030, 3031, 3032, ..., 303k, ..., and 303n each connected with the delay circuit 302. The operation of the laser control unit 301 is controlled by the control unit 30 illustrated in FIG. 1. The index "k" indicates the order of each element in a direction from the upstream side toward the downstream side in the traveling direction of the laser beam, which is a direction from left to right in FIG. 2, and is 0, 1, 2, ..., n.

In FIG. 2, the master oscillator is referred to as MO, and each amplifier is referred to as PA. This notation also applies in the following description. In FIG. 2, each high voltage switch circuit is referred to as an HV switch circuit, and this notation also applies in the following description. The optical shutter disposed closest to the MO 100 on the optical path of the laser beam emitted by the MO 100 is referred to as the zero-th optical shutter 320. The first PA 311, the first optical shutter 321, ..., the n-th PA 31n, and the n-th optical shutters 32n and 32n are sequentially disposed downstream of the zero-th optical shutter 320 on the optical path. The k-th PA 31k and the k-th optical shutter 32k are provided as a pair, as illustrated with parentheses denoted by k in FIG. 2, and n pairs thereof are provided in addition to the zero-th optical shutter 320. A high voltage pulse is applied to the k-th optical shutter 32k from the k-th HV switch circuit 303k as described later. In particular, the two n-th optical shutters 32n and 32n are provided to the n-th PA 31n. This will be described later in detail.

The MO 100 is preferably, for example, a $CO_2$ laser oscillator including a Q switch or a quantum cascade laser (QCL) configured to oscillate in the amplification wavelength band of $CO_2$ laser gas. When having received a light emission trigger signal S2 transferred from the control unit 30 through the laser control unit 301, the MO 100 outputs the pulse laser beam L. The pulse laser beam L may be linearly polarized light. The PAs 311, 312, ..., 31k, ..., and 31n may be each a discharged-pumped amplifier disposed on the optical path of the pulse laser beam L output from the MO 100 and containing $CO_2$ laser gas. The PAs 311, 312, ..., 31k, ..., and 31n may include $CO_2$ laser gas, a pair of electrodes, and a power source for performing high frequency discharge between the electrodes. With this configuration, the $CO_2$ laser gas may be pumped so that a predetermined excitation intensity is achieved at each of the PAs 311, 312, ..., 31k, ..., and 31n. When the MO 100 has a small power (several tens mW) like the above-described QCL, the PAs 311, 312, ..., 31k, ..., and 31n may be each a regenerative amplifier including an optical resonator, an EO pockels cell, and a polarizer.

The optical shutters 320, 321, 322, ..., 32k, ..., 32n, and 32n may each include an EO pockels cell or may each include an EO pockels cell and two polarizers. An optical shutter having low resistance to the pulse laser beam L is preferably disposed at a position on the upstream side where the pulse energy of the pulse laser beam L is relatively low, for example, between the MO 100 and the first PA 311 like the zero-th optical shutter 320 illustrated in FIG. 3.

Figure 3:
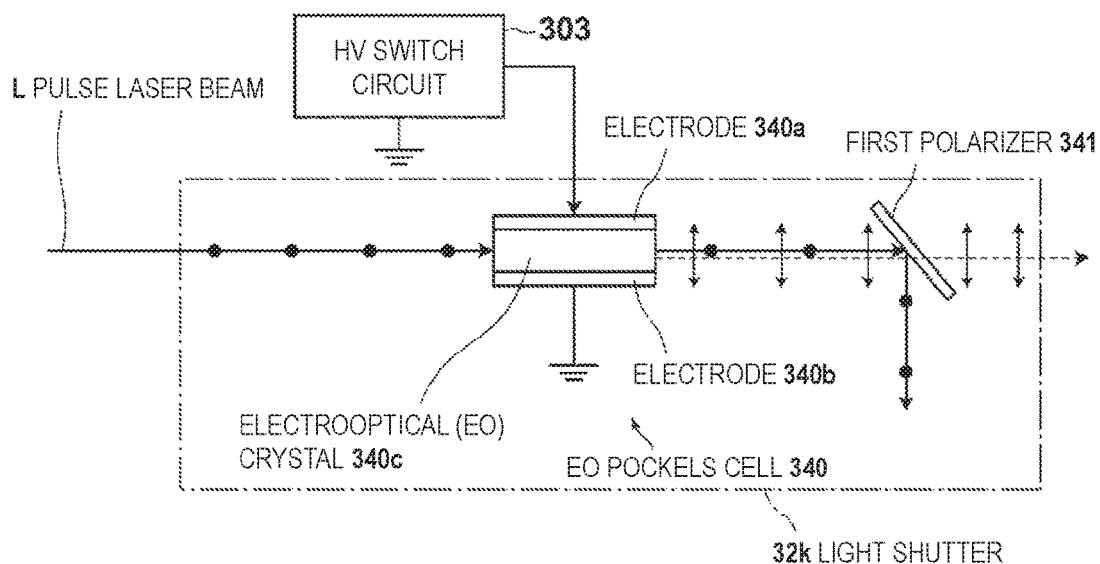
FIG. 3 is a schematic view illustrating an exemplary optical shutter.

FIG. 3 illustrates an exemplary optical shutter. This one optical shutter illustrated in FIG. 3 is representatively the optical shutter 32k. The optical shutter 32k includes an EO pockels cell 340, and a polarizer 341 disposed on the downstream side of the EO pockels cell 340 in the traveling direction of the pulse laser beam L. The EO pockels cell 340 includes, for example, electrodes 340a and 340b, and an electrooptical (EO) crystal 340c disposed between the electrodes. In the optical shutter 32k, high voltage at a predetermined value can be applied to the electrooptical crystal 340c from an HV switch circuit 303 controlled by a control circuit (not illustrated) through the electrodes 340a and 340b. Upon the high voltage application, the electrooptical crystal 340c rotates the linear polarization direction of the passing pulse laser beam L by 90°.

In FIG. 3, vertically extending arrows and circles are provided along the optical path of the pulse laser beam L. Each arrow indicates that the linear polarization direction of the pulse laser beam L is in a direction (vertical direction) parallel to the sheet of FIG. 3, and each circle indicates that the linear polarization direction of the pulse laser beam L is in a direction orthogonal to the sheet. In this example, the pulse laser beam L passing through the optical shutter 32k from left to right in FIG. 3, in particular, the pulse laser beam L linearly polarized in the direction orthogonal to the sheet is used. When no high voltage is applied to the electrooptical crystal 340c, the linearly polarized pulse laser beam L is incident on the polarizer 341 while maintaining the linear polarization direction thereof, and reflected at the polarizer 341. Accordingly, the pulse laser beam L is cut off at the optical shutter 32k.

When high voltage is applied to the electrooptical crystal 340c, the linear polarization direction of the pulse laser beam L is rotated by 90° by the electrooptical crystal 340c so that the pulse laser beam L can transmit through the polarizer 341 and pass through the optical shutter 32k. In this manner, the optical shutter 32k opens and closes depending on whether the high voltage application is performed. The EO pockels cell 340 typically has responsiveness of 1 ns approximately, and thus is applicable as an optical shutter driven at high speed.

Specifically, the electrooptical crystal 340c is preferably CdTe crystal or GaAs crystal. The pulse laser beam L having higher energy is incident on an optical shutter disposed on the downstream side in the traveling direction of the pulse laser beam L than on an optical shutter disposed on the upstream side. Thus, the optical shutter disposed on the downstream side desirably has high optical resistance. For example, the optical shutter on the upstream side may be made of CdTe crystal, and the optical shutter on the downstream side may be made of GaAs crystal. With this configuration, the value of voltage applied to the CdTe crystal and the value of voltage applied to the GaAs crystal may be different from each other. The polarizer 341 may be, for example, a $\lambda/2$ plate (½ wave plate) or a thin film polarizer (TFP).

1.2 Operation

In the configuration illustrated in FIG. 1, the target material in the tank 32 is heated to a predetermined temperature equal to or higher than the melting point thereof by the heater 33. For example, when the target material is Sn, Sn is heated to the temperature range of 250 to 290° C., which is equal to or higher than the melting point (232° C.) thereof. To perform the heating, the control unit 30 may control the operation of the heater 33 to perform temperature adjustment. The control unit 30 also controls the operation of the pressure adjuster 31 to maintain the pressure in the tank 32 at a pressure with which a jet of the melted target material is output at a predetermined speed from the nozzle 34. Then, the control unit 30 applies a droplet supply as a voltage signal having a predetermined waveform to the piezoelectric element 35 through a piezoelectric power source (not illustrated). Accordingly, the piezoelectric element 35 vibrates, and the vibration is provided to the nozzle 34. In this manner, the jet output from the nozzle 34 is divided in a predetermined period due to the vibration of the nozzle 34 so that the droplet DL is intermittently supplied.

The illumination light F output from the light source unit 42 of the droplet detection device 6 is received by the light receiving unit 45. As the droplet DL falling after generated as described above passes through the predetermined position P on the orbit Q, the illumination light F is blocked by the droplet DL. In this case, the received-light quantity of the illumination light F detected by the light receiving unit 45 decreases, and the signal level of an output signal output from the light receiving unit 45 decreases in accordance with the decrease of the received-light quantity. The timing at which the signal level becomes smaller than a certain threshold voltage indicates the timing at which the droplet DL passes through the predetermined position P. The output signal output from the light receiving unit 45 is input to the control unit 30. When having detected decrease of the signal level thereof, the control unit 30 generates the passing timing signal S1 and outputs the light emission trigger signal S2 a predetermined time after the passing timing signal S1.

Figure 4:
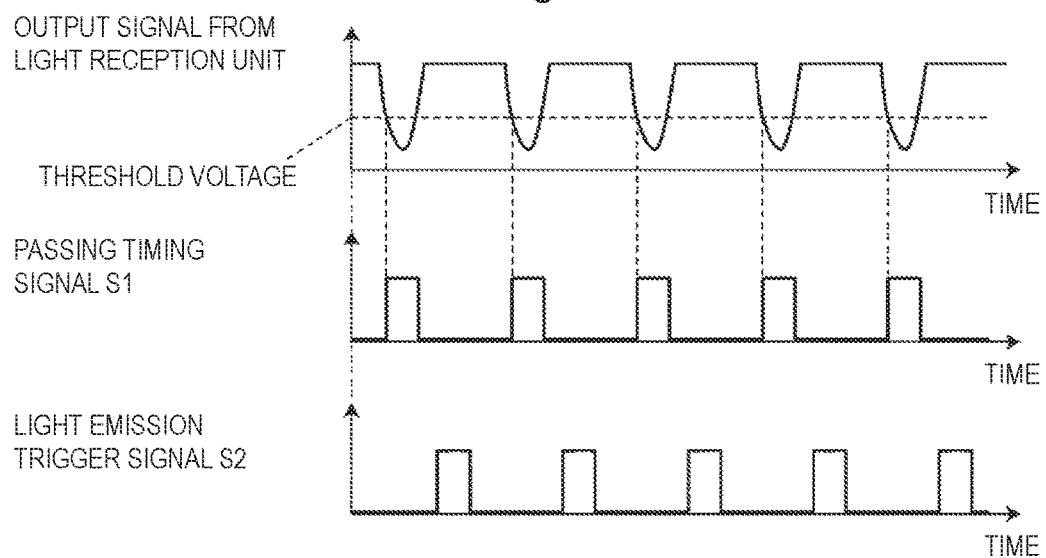
FIG. 4 is a timing chart illustrating the generation timing of each signal in the EUV light generation device illustrated in FIG. 1.

FIG. 4 is a timing chart illustrating the output signal from the light receiving unit 45, the threshold voltage, the passing timing signal S1, and the output timing of the light emission trigger signal S2 described above. In FIG. 4, the horizontal axis of a chart illustrating each signal represents time, and the vertical axis thereof represents the signal level. As illustrated in FIG. 4, the droplet detection device 6 generates a detection pulse as the passing timing signal S1 while the signal level of the output signal from the light receiving unit 45 has decreased from a reference value and is smaller than the threshold voltage. In other words, the passing timing signal S1 is turned on. In addition, the light emission trigger signal S2 is turned on in synchronization with the passing timing signal S1.

The light emission trigger signal S2 is input to the laser device 3. Having received the light emission trigger signal S2, the laser device 3 outputs the pulse laser beam L having a high intensity as described later in detail. The pulse laser beam L is reflected at the first high reflectance mirror 91 and the second high reflectance mirror 92 of the light transfer optical system 4, and then incident into the EUV chamber 1 through the window 15.

The pulse laser beam L is reflected at the high reflectance off-axis parabolic mirror 13 and the high reflectance plane mirror 14 of the laser focusing optical system 17, and then passes through an opening provided at a central part of the EUV light focusing mirror 21 and proceeds on the optical axis of the EUV light focusing mirror 21. The pulse laser beam L condenses in the plasma generation region 23 due to the effect of the high reflectance off-axis parabolic mirror 13. The droplet DL having reached the plasma generation region 23 becomes plasma through irradiation with the condensed pulse laser beam L. Then, EUV light is generated from the plasma. When not irradiated with the pulse laser beam L, the droplet DL is received by the target receiver 22.

The droplet DL is periodically generated, and the pulse laser beam L is output each time the droplet DL is detected by the droplet detection device 6. Accordingly, the EUV light is periodically generated. The EUV light periodically generated in this manner is incident on the exposure device 80 after having condensed at the intermediate focus point 24. At the exposure device 80, the incident EUV light is used for semiconductor exposure or the like.

The plasma generation region 23 is moved based on a command from the exposure device 80 in some cases. When the plasma generation region 23 is moved in a direction parallel to the droplet orbit Q, the delay time until the control unit 30 outputs the light emission trigger signal S2 after detection of decrease of the signal level of the passing timing signal S1 may be changed. In addition, the stage 10 may be actuated to move the high reflectance off-axis parabolic mirror 13 and the high reflectance plane mirror 14 through the second plate 12 in the direction parallel to the droplet orbit Q. When the plasma generation region 23 is moved in a plane orthogonal to the droplet orbit Q, the stage 10 may be actuated to move the high reflectance off-axis parabolic mirror 13 and the high reflectance plane mirror 14 through the second plate 12 in the plane orthogonal to the droplet orbit Q. In addition, the droplet supply unit 5 may be moved in the plane orthogonal to the droplet orbit Q by a droplet supply unit movement mechanism (not illustrated).

The following describes in detail generation of the pulse laser beam L in the laser device 3 illustrated in FIG. 2. The light emission trigger signal S2 is input as an external trigger signal to the laser control unit 301 in FIG. 2 from the control unit 30. The laser control unit 301 inputs the light emission trigger signal S2 to the MO 100. Having received the light emission trigger signal S2, the MO 100 outputs the pulse laser beam L. The laser control unit 301 also inputs the light emission trigger signal S2 to the delay circuit 302. Having received the light emission trigger signal S2, the delay circuit 302 outputs a light emission synchronization trigger signal S10 a predetermined delay time after the reception, and inputs the light emission synchronization trigger signal S10 to each of the HV switch circuits 3030, 3031, 3032, . . . , 303$k$, . . . , and 303$n$. The delay time is different between the HV switch circuits 3030, 3031, 3032, . . . , 303$k$, . . . , and 303$n$, in other words, between the optical shutters 320, 321, 322, . . . , and 32$n$.

Having received the light emission synchronization trigger signal S10, the HV switch circuits 3030, 3031, 3032, . . . , 303$k$, . . . , and 303$n$ apply high voltage pulses to the optical shutters 320, 321, 322, . . . , 32$k$, . . . , 32$n$, and 32$n$, respectively. In this case, the high voltage pulse is applied from the common HV switch circuit 303$n$ to the two optical shutters 32$n$ and 32$n$. The optical shutters 320, 321, 322, . . . , 32$k$, . . . , 32$n$, and 32$n$ close the optical path while no high voltage pulse is applied, but are opened, in other words, in a state that allows the pulse laser beam L to pass through the optical shutters while the high voltage pulse is applied. The mechanism of the opening and closing of the optical shutters is as described above. The delay time for each of the optical shutters 320, 321, 322, . . . , 32$k$, . . . , and 32$n$ is set in accordance with the optical path length from the MO 100 to the optical shutter. Specifically, the optical shutters 320, 321, 322, . . . , 32$k$, . . . , and 32$n$ are each configured to open at a timing slightly before the pulse laser beam L reaches the optical shutter.

Figure 5:
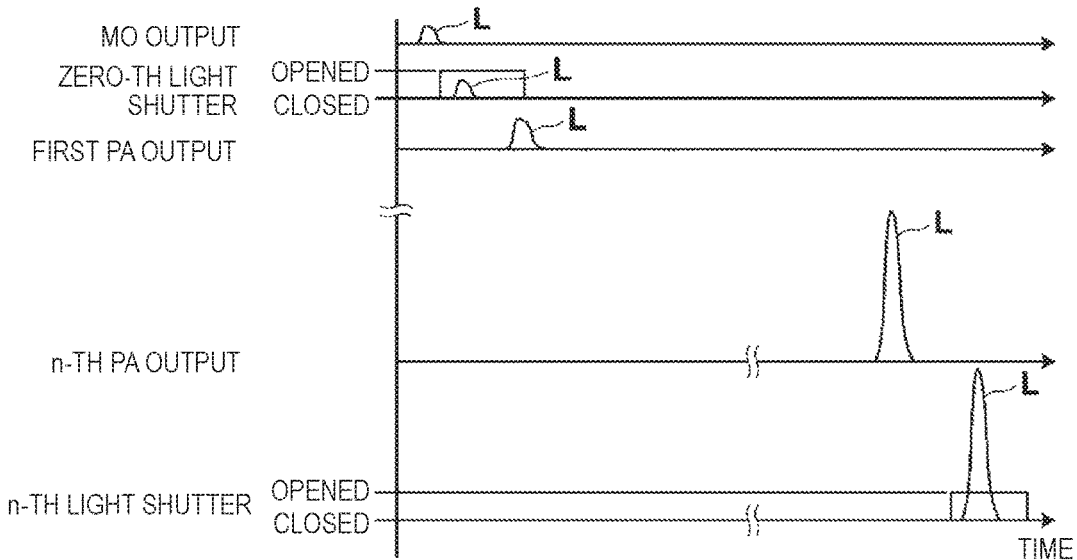
FIG. 5 is a timing chart illustrating the generation timing of each signal in the laser device illustrated in FIG. 2.

FIG. 5 schematically illustrates the relation between the timing at which each optical shutter opens and the timing at which the pulse laser beam L passes through the optical shutter. In FIG. 5, the pulse wave shape of the pulse laser beam L is illustrated. FIG. 5 illustrates, as examples, the timing at which the zero-th optical shutter 320 on the most upstream side in the traveling direction of the pulse laser beam L opens, and the timing at which the n-th optical shutter 32$n$ on the most downstream side opens. In addition, FIG. 5 sequentially illustrates, from the upper side, the timing at which the pulse laser beam L passes through the zero-th optical shutter 320, the timing at which the pulse laser beam L passes through the first PA 311, the timing at which the pulse laser beam L passes through the n-th PA 31$n$, and the timing at which the pulse laser beam L passes through the n-th optical shutter 32$n$.

As illustrated in FIG. 5, each optical shutter becomes opened at a timing slightly before the pulse laser beam L reaches the optical shutter, and remains opened for a duration longer than the pulse width of the pulse laser beam L. Then, the optical shutter becomes closed after the pulse laser beam L passes through the optical shutter. Since the above-described delay time is set for each of the optical shutters 320, 321, 322, . . . , 32$k$, . . . , and 32$n$ disposed in series on the optical path of the pulse laser beam L, the optical shutters being closed sequentially become opened in accordance with timings at which the pulse laser beam L is incident on the optical shutters.

As the optical shutters 320, 321, 322, . . . , 32$k$, . . . , and 32$n$ become opened as described above, the pulse laser beam L is sequentially incident on the PAs 311, 312, . . . , 31$k$, . . . , and 31$n$. The pulse laser beam L is sequentially amplified by the PAs 311, 312, ..., 31k, ..., and 31n, and accordingly, obtains a high intensity.

Spontaneously emitted light is output from the PAs 311, 312, ..., 31k, ..., and 31n in the excited state. Since the PAs 311, 312, ..., 31k, ..., and 31n are disposed in series, spontaneously emitted light emitted by a certain PA (amplifier) is amplified by another PA, which results in a laser oscillation phenomenon in some cases. This phenomenon is called self-oscillation. When a target including a droplet is irradiated with the pulse laser beam L, part of the pulse laser beam L is reflected at the target. The pulse laser beam L reflected at the target moves backward on the laser beam path while being amplified at PAs in the excited state in some cases. This backward laser beam is typically called return light.

Self-oscillation light and return light are sometimes output at unexpected energies and potentially break down the MO 100 illustrated in FIG. 2 or an optical element disposed on the optical path of the MO 100. Furthermore, self-oscillation light and return light consume the laser gain of an excited PA, and thus cause decrease of the amplification factor. For these reasons, the optical shutters 320, 321, 322, ..., 32k, ..., and 32n desirably have the function of an optical isolator configured to cut off light moving backward through the optical path of the MO 100. In this case, damage on the laser device due to self-oscillation light and return light can be reduced to stabilize an output laser beam.

To improve the above-described reduction effect of return light, for example, the optical shutter at the final stage may desirably have a particularly low transmissivity when closed. This can be achieved by an optical shutter structure in which a plurality of EO pockels cells are disposed in series and adjacent to each other on the laser beam path. The two optical shutters 32n and 32n illustrated in FIG. 2 are disposed to meet this request.

2. Comparative Example

2.1 Configuration

Figure 6:
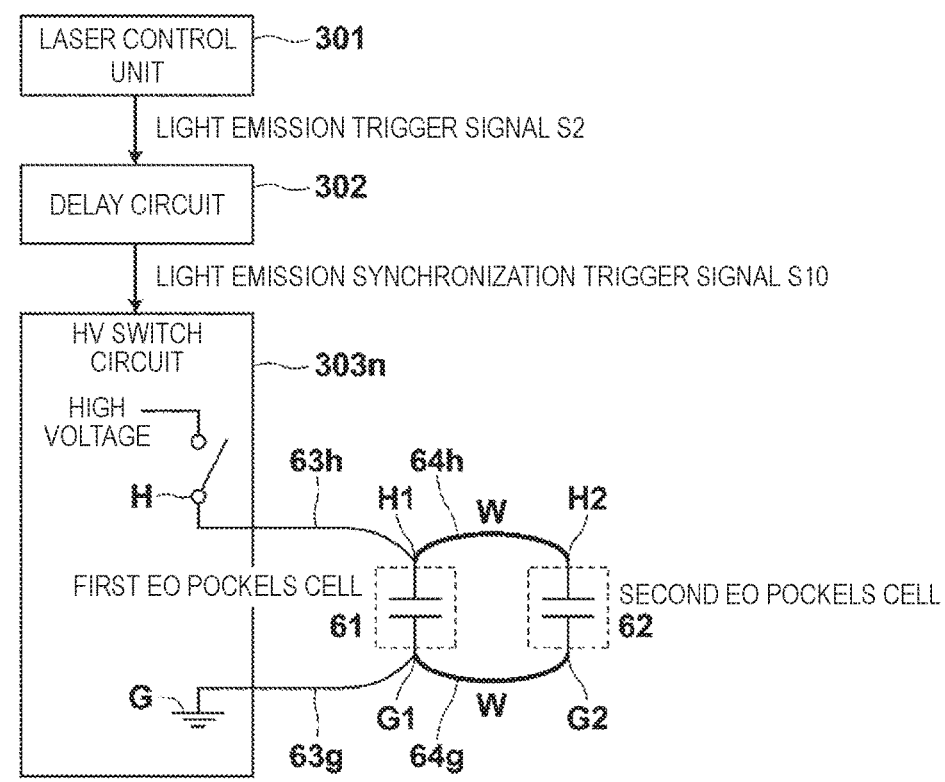
FIG. 6 is a schematic view illustrating a main part of a laser device as a comparative example.

The following describes a laser device as a comparative example with reference to FIG. 6. FIG. 6 selectively illustrates in detail the HV switch circuit 303n as one of the HV switch circuits included in the laser device 3 illustrated in FIG. 2 and components connected with the HV switch circuit 303n. The configuration illustrated in FIG. 6 includes the HV switch circuit 303n, the delay circuit 302 disposed before the HV switch circuit 303n, and the laser control unit 301 disposed before the delay circuit 302. The laser control unit 301 and the delay circuit 302 are same as those illustrated in FIG. 2. As illustrated in FIG. 2, the two n-th optical shutters 32n and 32n disposed optically in series on the optical path of the pulse laser beam L are connected with the HV switch circuit 303n.

More specifically, the two n-th optical shutters 32n and 32n each include an EO pockels cell described above. FIG. 6 specifically illustrates the EO pockels cells as a first EO pockels cell 61 and a second EO pockels cell 62. The first EO pockels cell 61 is disposed upstream of the second EO pockels cell 62 on the optical path of the pulse laser beam L. The reflection direction of a polarizer disposed accompanying each of the first EO pockels cell 61 and the second EO pockels cell 62 may be set as appropriate based on the direction of rotation of linearly polarized light by the EO pockels cell.

The HV switch circuit 303n includes, for example, a semiconductor switch and a high voltage source. The high voltage source and the HV switch circuit 303n constitute a power source device in the present disclosure. A high voltage switch terminal of the HV switch circuit 303n is connected with one electrode side of the first EO pockels cell 61 through a high-voltage side wire 63h. A ground terminal of the HV switch circuit 303n is connected with the other electrode side of the first EO pockels cell 61 through a ground-side wire 63g. The one electrode and the other electrode of the first EO pockels cell 61 are the electrode 340a and the electrode 340b illustrated in, for example, FIG. 3, in other words, electrodes for applying high voltage to the electrooptical (EO) crystal 340c. The one electrode of the first EO pockels cell 61 is connected with one electrode of the second EO pockels cell 62 through a high-voltage side shared wire 64h. The other electrode of the first EO pockels cell 61 is connected with the other electrode of the second EO pockels cell 62 through a ground-side shared wire 64g. In the present example, the length of the high-voltage side shared wire 64h and the length of the ground-side shared wire 64g are equal to a common length W. Similarly, the one electrode and the other electrode of the second EO pockels cell 62 are the electrode 340a and the electrode 340b illustrated in, for example, FIG. 3. In this manner, the first EO pockels cell 61 and the second EO pockels cell 62 are connected with the HV switch circuit 303n electrically in parallel with each other.

2.2 Operation

Figure 7:
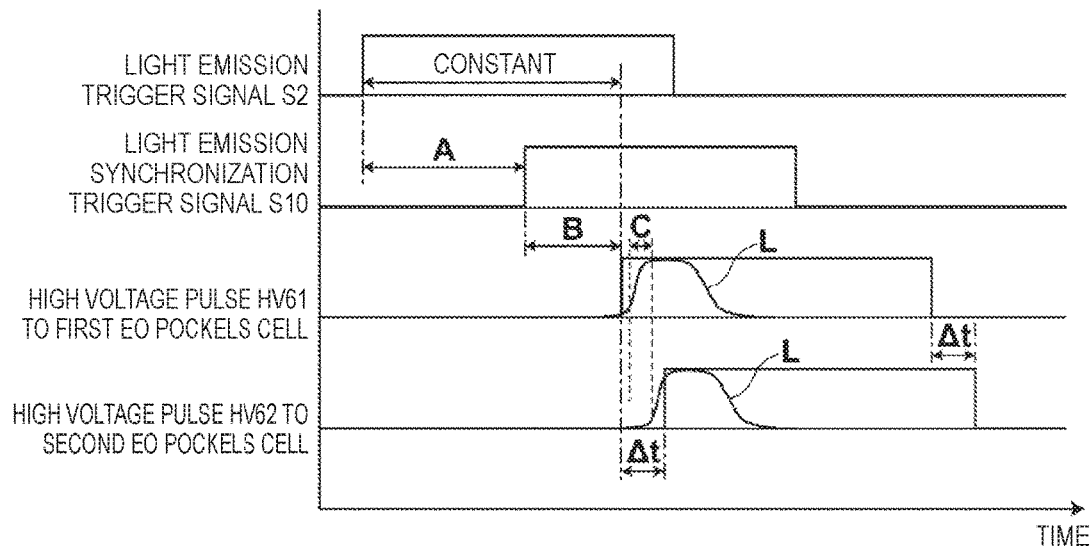
FIG. 7 is a timing chart illustrating the generation timing of each signal in the configuration illustrated in FIG. 6.

As illustrated in FIGS. 1 and 2, the light emission trigger signal S2 is input from the control unit 30 to the laser control unit 301. The light emission trigger signal S2 is input to the delay circuit 302 through the laser control unit 301, and the delay circuit 302 outputs the light emission synchronization trigger signal S10 a predetermined delay time after the inputting. In FIG. 7, the delay time for the light emission synchronization trigger signal S10 output to the HV switch circuit 303n is referred to as Delay Time A. Having received the light emission synchronization trigger signal S10, the HV switch circuit 303n performs a switching operation to apply a predetermined high voltage pulse from the high voltage source to the first EO pockels cell 61 and the second EO pockels cell 62 connected in parallel with each other. Upon the high voltage pulse application, the optical shutters each including the first EO pockels cell 61 and the second EO pockels cell 62 become opened so that the pulse laser beam L (refer to FIG. 2) sequentially passes through the optical shutters.

2.3 Problem

FIG. 7 is a timing chart illustrating the generation timing of each signal in the configuration illustrated in FIG. 6 together with the progress position of the pulse laser beam L. The following describes the generation timing with reference to FIG. 7. In FIG. 7, the horizontal axis represents time. FIG. 7 illustrates, sequentially from the uppermost row toward the lower side, the waveforms and generation timings of the light emission trigger signal S2, the light emission synchronization trigger signal S10, a high voltage pulse HV61 applied to the first EO pockels cell 61, and a high voltage pulse HV62 applied to the second EO pockels cell 62. FIG. 7 also illustrates the timing at which the pulse laser beam L passes through the first EO pockels cell 61 and the timing at which the pulse laser beam L passes through the second EO pockels cell 62 together with the high voltage pulse HV61 and the high voltage pulse HV62, respectively. The pulse laser beam L is illustrated in the pulse wave shape thereof.

As illustrated in FIG. 7, the outputting of the light emission synchronization trigger signal S10 is started when substantially constant Delay Time A has elapsed since the outputting of the light emission trigger signal S2 is started. Then, the outputting of the high voltage pulse HV61 is started Time B after the outputting of the light emission synchronization trigger signal S10 is started. Then, the pulse laser beam L passes through the first EO pockels cell 61 while the high voltage pulse HV61 is applied to the first EO pockels cell 61. Accordingly, the pulse laser beam L can pass through the first EO pockels cell 61 over the pulse full width thereof, and the pulse laser beam L hardly attenuates during the passing. The time (A+B) is typically constant.

The duration in which the high voltage pulse HV62 is applied to the second EO pockels cell 62 is delayed by a time Δt behind the duration in which the high voltage pulse HV61 is applied to the first EO pockels cell 61. This delay occurs because a wiring length from the high-voltage side of the HV switch circuit 303n to the ground point through the second EO pockels cell 62 is longer than a wiring length from the high-voltage side of the HV switch circuit 303n to the ground point through the first EO pockels cell 61. More specifically, the wiring length through points H, H1, H2, G2, G1, and G in FIG. 6 is longer than the wiring length through points H, H1, G1, and G by 2 W. W represents the length of each of the high-voltage side shared wire 64h and the ground-side shared wire 64g. When the duration in which the high voltage pulse HV62 is applied to the second EO pockels cell 62 is delayed as described above, the pulse laser beam L cannot pass through the second EO pockels cell 62 over the full width in some cases. FIG. 7 illustrates a situation in this case. In this situation, the pulse laser beam L significantly attenuates when passing through the second EO pockels cell 62.

The description is made with realistic numerical examples. The optical path length from the light incident end of the first EO pockels cell 61 to the light incident end of the second EO pockels cell 62 for the pulse laser beam L is, for example, 0.3 m. A time taken for the pulse laser beam L to pass through this length is 1 ns (nanosecond) approximately. When the delay time Δt due to wiring is extremely shorter than the above-described 1 ns, the attenuation of the pulse laser beam L can be reduced while the application duration of the high voltage pulse HV62 is delayed behind the application duration of the high voltage pulse HV61 as described above. The delay time due to wiring is given by Δt=2 W×(wire electric signal speed) and thus is 10 ns with, for example, the wire electric signal speed of a copper wire=5 ns/m (nanosecond/meter) and W=1 m. The delay time Δt=10 ns is significantly longer than the above-described 1 ns, and thus it is difficult to reduce the attenuation of the pulse laser beam L.

Alternatively, a dedicated HV switch circuit can be connected with each of a plurality of EO pockels cells to individually adjust the delay time for the light emission synchronization trigger signal input to each HV switch circuit. However, this configuration increases cost of the laser device and complicates control.

3. Embodiment 1

3.1 Configuration of Embodiment 1

Figure 8:
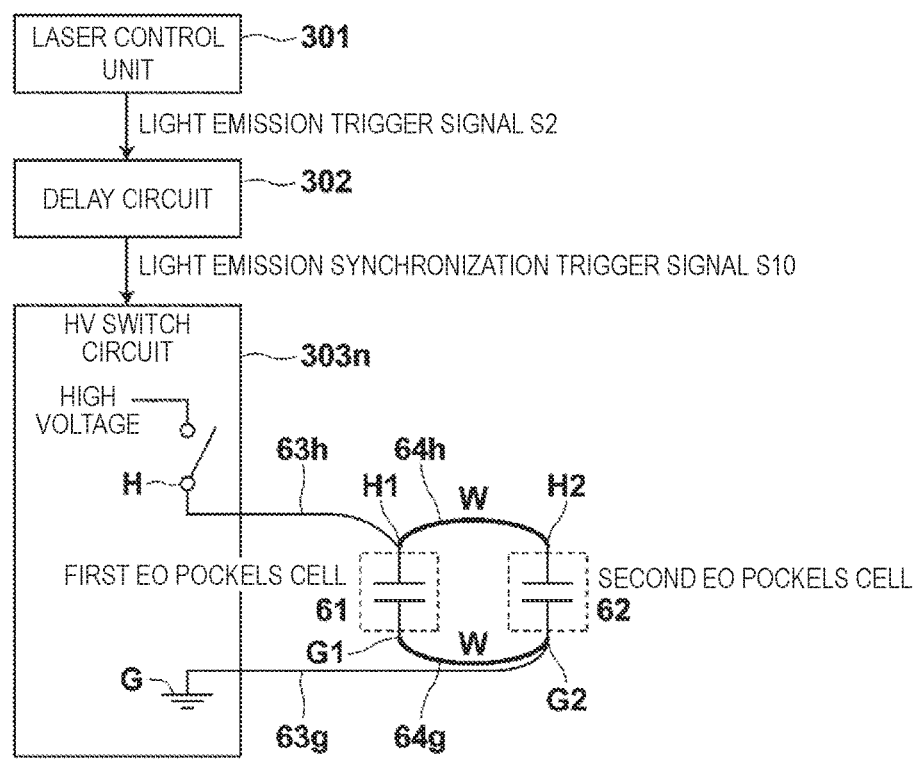
FIG. 8 is a schematic view illustrating a main part of a laser device according to Embodiment 1.
Figure 9:
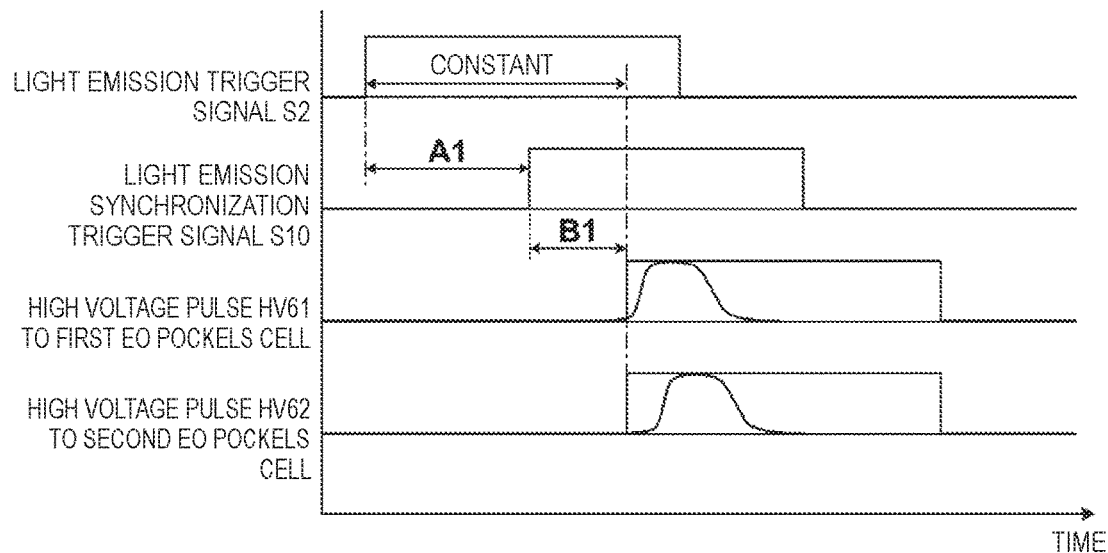
FIG. 9 is a timing chart illustrating the generation timing of each signal in the configuration illustrated in FIG. 8.

The following describes a laser device according to Embodiment 1 with reference to FIGS. 8 and 9. In FIGS. 8 and 9, any component identical to that illustrated in FIGS. 1 to 7 is denoted by an identical reference sign, and description thereof will be omitted unless needed otherwise (this also applies to the other following description). FIG. 8 illustrates a main part of the laser device according to Embodiment 1 with blocks, and schematically illustrates wiring in the main part. The configuration illustrated in FIG. 8 is applicable to the laser device 3 illustrated in FIGS. 1 and 2. In the configuration illustrated in FIG. 8, the high voltage switch terminal of the HV switch circuit 303n is connected with the one electrode side of the first EO pockels cell 61 through the high-voltage side wire 63h. The ground terminal of the HV switch circuit 303n is connected with the other electrode side of the second EO pockels cell 62 through the ground-side wire 63g. The laser device according to Embodiment 1 is different from the laser device illustrated in FIG. 6 in the above-described wiring configuration, but is same as the laser device illustrated in FIG. 6 in the other configuration. Specifically, the one electrode of the first EO pockels cell 61 is connected with the one electrode of the second EO pockels cell 62 through the high-voltage side shared wire 64h. The other electrode of the first EO pockels cell 61 is connected with the other electrode of the second EO pockels cell 62 through the ground-side shared wire 64g. The length of the high-voltage side shared wire 64h and the length of the ground-side shared wire 64g are equal to the common length W.

3.2 Operation of Embodiment 1

The operation of the laser device according to Embodiment 1 is basically same as the operation of the laser device as a comparative example described above.

3.3 Effect of Embodiment 1

In the configuration illustrated in FIG. 8, the wiring length between the HV switch circuit 303n and the first EO pockels cell 61 is basically equal to the wiring length between the HV switch circuit 303n and the second EO pockels cell 62. More specifically, when described with the points in FIG. 8, the former wiring length is the length through H, H1, G1, G2, and G, and the latter wiring length is the length through H, H1, H2, G2, and G. Since the distance from G1 to G2 and the distance from H1 to H2 are both equal to W, both wiring lengths are basically equal to each other and are (the length of the high-voltage side wire 63h)+(the length of the ground-side wire 63g)+W.

FIG. 9 is a timing chart illustrating the generation timing of each signal in the configuration illustrated in FIG. 8 together with the progress position of the pulse laser beam L. The scheme of notation in FIG. 9 is same as that in FIG. 7. As illustrated in FIG. 9, in Embodiment 1, the application duration of the high voltage pulse HV62 is not delayed behind the application duration of the high voltage pulse HV61. This leads to reduction of the attenuation of the pulse laser beam L when passing through the second EO pockels cell 62.

As described above, the application timings of the high voltage pulses HV61 and HV62 depend on the length W of the high-voltage side shared wire 64h or the ground-side shared wire 64g. In the example illustrated in FIG. 9, Time B1 between the outputting of the light emission synchronization trigger signal S10 and the outputting of the high voltage pulse HV61 and the high voltage pulse HV62 is equal to the sum of a certain constant time and Time B0 taken for an electric signal to conduct through the wiring length W. For example, when the wire electric signal speed of a copper wire is 5 ns/m (nanosecond/meter) as described above, Time B0 is given by W×5 ns/m.

To reduce the dependency of the application timings of the high voltage pulses HV61 and HV62 on the wiring length W as described above, the delay time at the delay circuit 302 may be changed in accordance with the wiring length W. Specifically, in the example illustrated in FIG. 9, Time A1 until the outputting of the light emission synchronization trigger signal S10 is started after the outputting of the light emission trigger signal S2 is started may be set to be a time obtained by subtracting Time B0=W×5 ns/m described above from a certain constant time. When Delay Time A1 is controlled in accordance with the wiring length W in this manner, the application timings of the high voltage pulses HV61 and HV62 can be fixed with respect to the passing timing of the pulse laser beam L independently from the wiring length W.

4. Embodiment 2

4.1 Configuration of Embodiment 2

Figure 10:
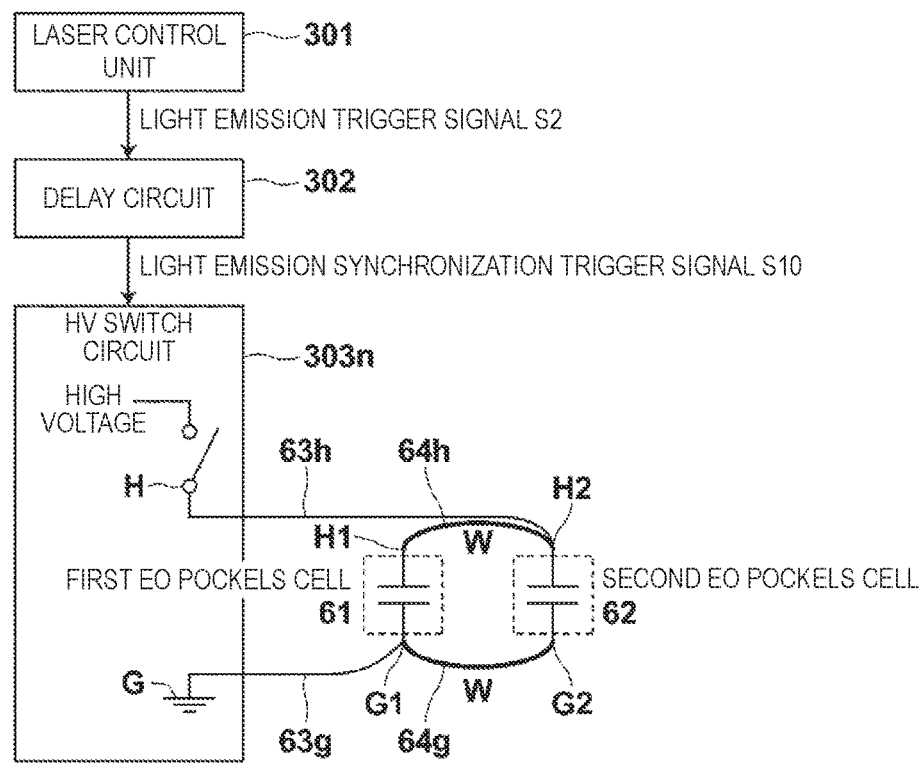
FIG. 10 is a schematic view illustrating a main part of a laser device according to Embodiment 2.

The following describes a laser device according to Embodiment 2 with reference to FIG. 10. The laser device according to Embodiment 2 can be employed as the laser device 3 illustrated in FIGS. 1 and 2. The configuration illustrated in FIG. 10 is different from the configuration of Embodiment 1 illustrated in FIG. 8 in connection of the high-voltage side wire 63h and the ground-side wire 63g, but same as the configuration illustrated in FIG. 8 in the other configuration. Specifically, in Embodiment 2, the high-voltage side wire 63h is connected with the second EO pockels cell 62 on the downstream side in the traveling direction of the pulse laser beam L, and the ground-side wire 63g is connected with the first EO pockels cell 61 on the upstream side in the traveling direction.

4.2 Operation of Embodiment 2

The operation of the laser device according to Embodiment 2 is same as the operation of the laser device according to Embodiment 1.

4.3 Effect of Embodiment 2

The effect of the laser device according to Embodiment 2 is same as the effect of the laser device according to Embodiment 1.

5. Embodiment 3

5.1 Configuration of Embodiment 3

Figure 11:
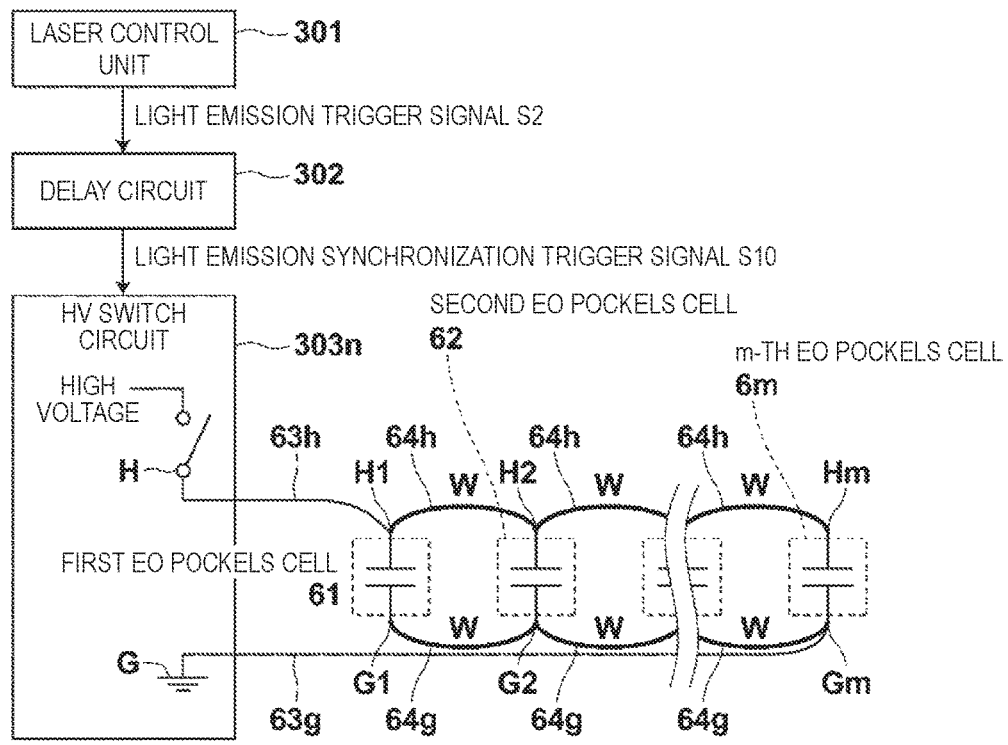
FIG. 11 is a schematic view illustrating a main part of a laser device according to Embodiment 3.
Figure 12:
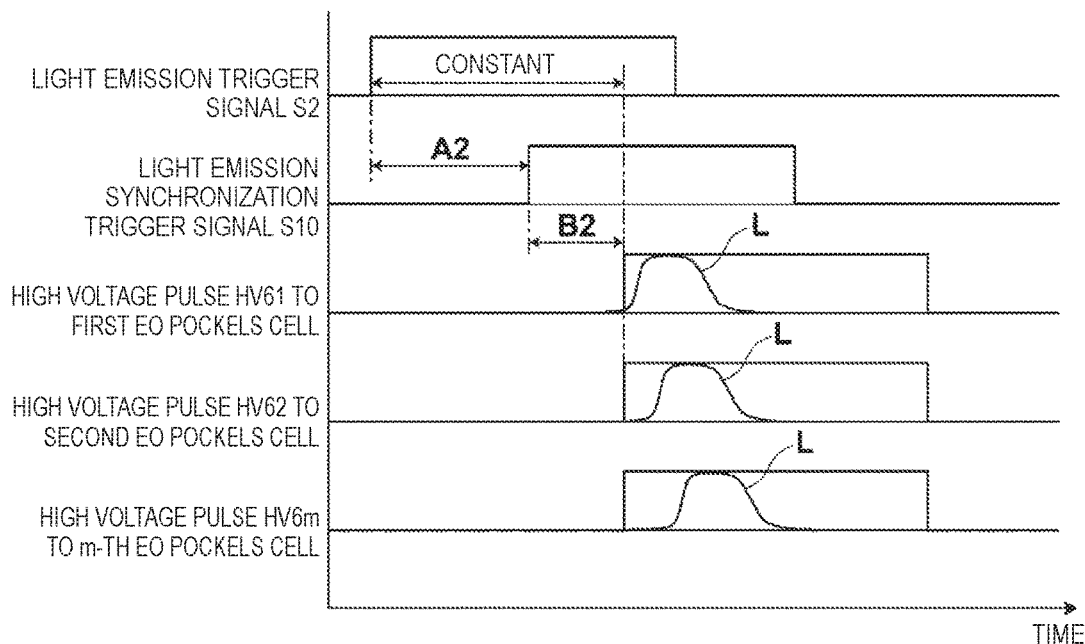
FIG. 12 is a timing chart illustrating the generation timing of each signal in the configuration illustrated in FIG. 11.

The following describes a laser device according to Embodiment 3 with reference to FIGS. 11 and 12. FIG. 11 illustrates a main part of the laser device according to Embodiment 3 with blocks, and schematically illustrates wiring in the main part. The configuration illustrated in FIG. 11 is applicable to the laser device 3 illustrated in FIGS. 1 and 2. The configuration illustrated in FIG. 11 is different from the configuration of Embodiment 1 illustrated in FIG. 8 in that the number of EO pockels cells is larger than two. In this example, the number of EO pockels cells is m that is equal to or larger than three. More specifically, the first EO pockels cell 61, the second EO pockels cell 62, . . . , and a m-th EO pockels cell 6m are disposed optically in series with each other on the optical path of the pulse laser beam L (refer to FIG. 2) sequentially from the optical path upstream side.

The one electrode of each of the first EO pockels cell 61, the second EO pockels cell 62, . . . , and the m-th EO pockels cell 6m is connected with the one electrode of another EO pockels cell through the high-voltage side shared wire 64h disposed between the EO pockels cells. The other electrode of each of the first EO pockels cell 61, the second EO pockels cell 62, . . . , and the m-th EO pockels cell 6m is connected with the other electrode of another EO pockels cell through the ground-side shared wire 64g disposed between the EO pockels cells. For example, the lengths of the (m−1) high-voltage side shared wires 64h are equal to each other at the length W. For example, the lengths of the (m−1) ground-side shared wires 64g are equal to each other at the length W. The length of each high-voltage side shared wire 64h and the length of each ground-side shared wire 64g are equal to each other at the length W. The HV switch circuit 303n is connected with, through the high-voltage side wire 63h, the one electrode side of the first EO pockels cell 61 disposed on the most upstream side on the optical path. The ground terminal of the HV switch circuit 303n is connected with, through the ground-side wire 63g, the other electrode side of the m-th EO pockels cell 6m disposed on the most downstream side on the optical path.

5.2 Operation of Embodiment 3

The operation of the laser device according to Embodiment 3 is same as the operation of the laser device according to Embodiment 1.

5.3 Effect of Embodiment 3

The effect of the laser device according to Embodiment 3 is basically same as the effect of the laser device according to Embodiment 1. More specifically, in the configuration illustrated in FIG. 11, the wiring length between the HV switch circuit 303n and one EO pockels cell is given by (the length of the high-voltage side wire 63h)+(the length of the ground-side wire 63g)+(m−1)W. This wiring length is constant for the respective m EO pockels cells 61, 62, . . . , and 6m.

FIG. 12 is a timing chart illustrating the generation timing of each signal in the configuration illustrated in FIG. 11 together with the progress position of the pulse laser beam L. The scheme of notation in FIG. 12 is same as that in FIG. 7. As illustrated in FIG. 12, in Embodiment 3, the application durations of the high voltage pulses HV61, 62, . . . , and 6m applied to the first EO pockels cell 61, the second EO pockels cell 62, . . . , and the m-th EO pockels cell 6m, respectively, coincide with each other at a certain timing. This is because the wiring length between the HV switch circuit 303n and each EO pockels cell is constant as described above. Accordingly, in Embodiment 3 as well, the attenuation of the pulse laser beam L when passing through the EO pockels cell is reduced.

In Embodiment 3 as well, the application timing of each of the high voltage pulses HV61, HV62, . . . , and HV6m depends on the length W of each high-voltage side shared wire 64h or each ground-side shared wire 64g. More specifically, the application timing of the high voltage pulse depends on the wiring length (m−1)W of the high-voltage side shared wires 64h or the ground-side shared wires 64g in the wiring length between the HV switch circuit 303n and one EO pockels cell. In the example illustrated in FIG. 12, Time B2 between the outputting of the light emission synchronization trigger signal S10 and the outputting of the high voltage pulses HV61, HV62, ..., and HV6m is equal to the sum of a certain constant time and Time Bt taken for an electric signal to conduct through the wiring length (m−1)W. When the wire electric signal speed of a copper wire is 5 ns/m (nanosecond/meter) as described above, Time Bt is given by (m−1)W×5 ns/m.

To reduce the dependency of the application timings of the high voltage pulses HV61, HV62, ..., and HV6m on the wiring length (m−1)W as described above, the delay time at the delay circuit 302 may be changed in accordance with the wiring length (m−1)W. Specifically, in the example illustrated in FIG. 12, Time A2 until the outputting of the light emission synchronization trigger signal S10 is started after the outputting of the light emission trigger signal S2 is started may be set to be a time obtained by subtracting the above-described Time Bt=(m−1)W×5 ns/m from a certain constant time. When Delay Time A2 is controlled in accordance with the wiring length (m−1)W in this manner, the application timings of the high voltage pulses HV61, 62, ..., and 6m can be fixed with respect to the passing timing of the pulse laser beam L independently from the wiring length (m−1)W.

The pulse widths of the high voltage pulses HV61, HV62, ..., and HV6m may be adjusted as appropriate in accordance with the number m of EO pockels cells connected with the single HV switch circuit 303n, and the optical path length between a plurality of EO pockels cells.

6. Embodiment 4

6.1 Configuration of Embodiment 4

Figure 13:
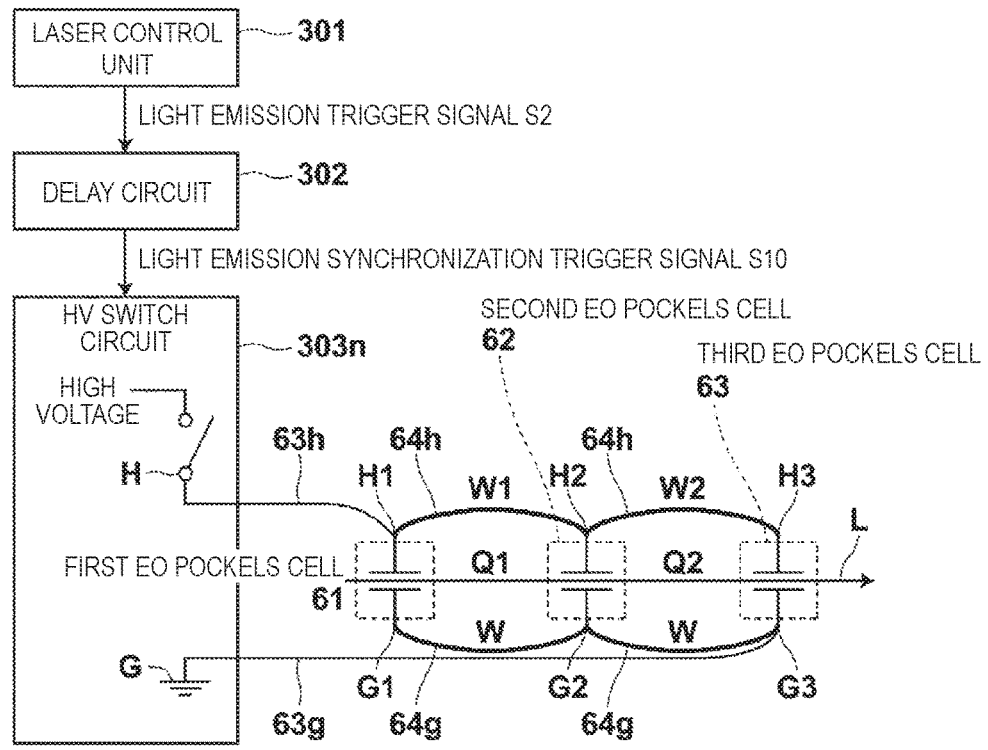
FIG. 13 is a schematic view illustrating a main part of a laser device according to Embodiment 4.
Figure 14:
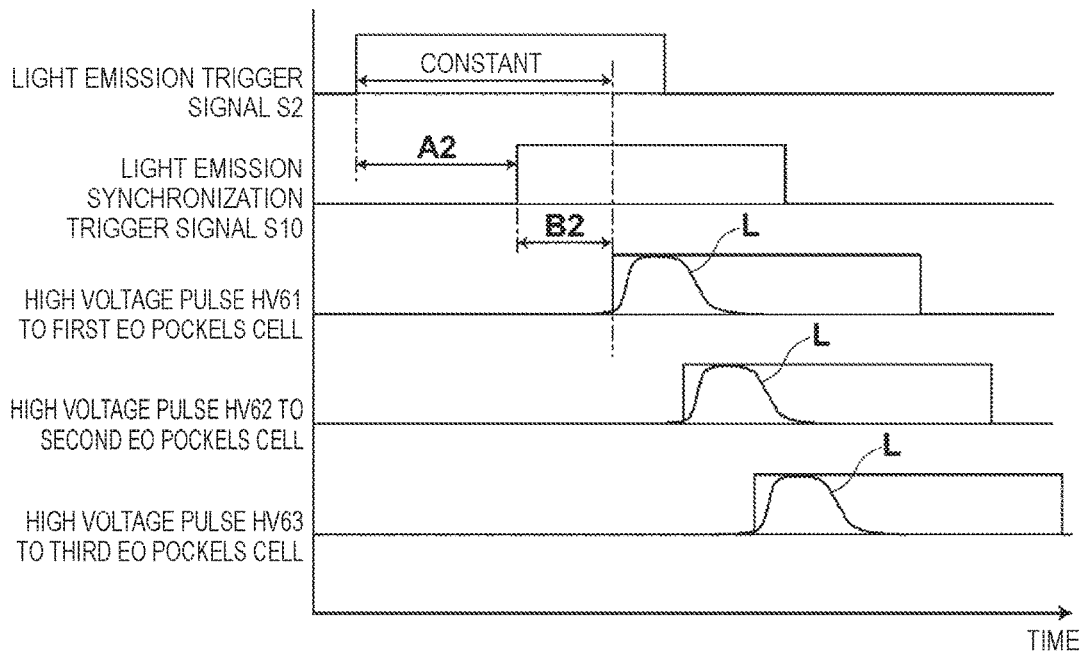
FIG. 14 is a timing chart illustrating the generation timing of each signal in the configuration illustrated in FIG. 13.

The following describes a laser device according to Embodiment 4 with reference to FIGS. 13 and 14. FIG. 13 illustrates a main part of the laser device according to Embodiment 4 with blocks, and schematically illustrates wiring in the main part. The configuration illustrated in FIG. 13 is applicable to the laser device 3 illustrated in FIGS. 1 and 2. The configuration illustrated in FIG. 13 is different from the configuration of Embodiment 1 illustrated in FIG. 8 in that three EO pockels cells are provided and two high-voltage side shared wires 64h are provided and have lengths W1 and W2 different from each other.

In the configuration illustrated in FIG. 13, a first EO pockels cell 61, a second EO pockels cell 62, and a third EO pockels cell 63 are disposed optically in series with each other sequentially from the upstream side on the optical path of the pulse laser beam L. The length of the ground-side shared wire 64g between the first EO pockels cell 61 and the second EO pockels cell 62 and the length of the ground-side shared wire 64g between the second EO pockels cell 62 and the third EO pockels cell 63 are equal to each other at W. The length of the high-voltage side shared wire 64h between the first EO pockels cell 61 and the second EO pockels cell 62 is W1, the length of the high-voltage side shared wire 64h between the second EO pockels cell 62 and the third EO pockels cell 63 is W2, and thus the lengths are different from each other. The optical path length between the first EO pockels cell 61 and the second EO pockels cell 62 is represented by Q1, and the optical path length between the second EO pockels cell 62 and the third EO pockels cell 63 is represented by Q2. The length W1 of the high-voltage side shared wire 64h is W+0.67Q1, and the length W2 of the high-voltage side shared wire 64h is W+0.67Q2. Like a typical assumption, it is assumed that, in the high-voltage side shared wire 64h, an electric signal conducts at 5.0 ns/m, which is 0.67 times larger than the propagation speed of the pulse laser beam L being 3.3 ns/m.

6.2 Operation of Embodiment 4

The operation of the laser device according to Embodiment 4 is same as the operation of the laser device according to Embodiment 1.

6.3 Effect of Embodiment 4

FIG. 14 is a timing chart illustrating the generation timing of each signal in the configuration illustrated in FIG. 13 together with the progress position of the pulse laser beam L. The scheme of notation in FIG. 14 is same as that in FIG. 7. As illustrated in FIG. 14, in Embodiment 4, unlike the above-described embodiments, the application timings of the high voltage pulses HV62 and HV63 do not coincide with the application timing of the high voltage pulse HV61. Specifically, the application of the high voltage pulse HV62 is delayed behind the application of the high voltage pulse HV61, and the application of the high voltage pulse HV63 is delayed behind the application of the high voltage pulse HV62. Since the length W1 of the high-voltage side shared wire 64h is set to be W+0.67Q1 as described above, the delay time of the former delay is equal to a time taken for the pulse laser beam L to proceed from the first EO pockels cell 61 to the second EO pockels cell 62. Since the length W2 of the high-voltage side shared wire 64h is set to be W+0.67Q2 as described above, the delay time of the latter delay is equal to a time taken for the pulse laser beam L to proceed from the second EO pockels cell 62 to the third EO pockels cell 63. In this manner, in Embodiment 4, the pockels cells 61, 62, and 63 are opened at timings right before the respective arrival timings of the pulse laser beam L, which coincide with the timings at which the pulse laser beam L is incident on the first EO pockels cell 61, the second EO pockels cell 62, and the third EO pockels cell 63, respectively. Accordingly, in Embodiment 4 as well, the attenuation of the pulse laser beam L when passing through each EO pockels cell is reduced.

In Embodiment 4, similarly to Embodiment 3, to reduce the dependency of the application timing of the high voltage pulse HV61 on the wiring length W, the delay time at the delay circuit 302 may be changed in accordance with the wiring length W. Specifically, in the example illustrated in FIG. 14, Time A2 until the outputting of the light emission synchronization trigger signal S10 is started since the outputting of the light emission trigger signal S2 is started may be set to be a time obtained by subtracting Time Bt=2 W×5 ns/m from a certain constant time.

Figure 15:
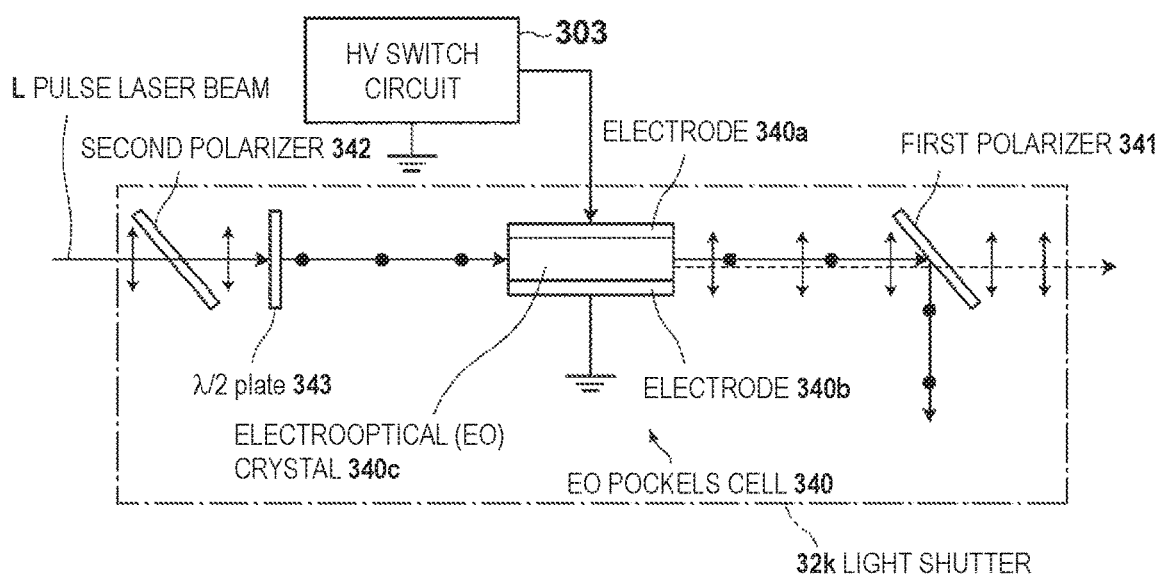
FIG. 15 is a schematic view illustrating another exemplary optical shutter.

The following describes another exemplary optical shutter that can be used in each laser device of the present disclosure with reference to FIG. 15. The optical shutter 32k illustrated in FIG. 15 is different from that illustrated in FIG. 3 in that a second polarizer 342 and a λ/2 plate (½ wave plate) 343 are disposed upstream of the EO pockels cell 340 in the traveling direction of the laser beam sequentially from the upstream side. In the following description, the polarizer 341 illustrated in FIG. 3 is referred to as the first polarizer 341.

In the configuration illustrated in FIG. 15, the pulse laser beam L passing through the optical shutter 32k from left to right in FIG. 15, and particularly, linearly polarized in the vertical direction in FIG. 15 is used. This linearly polarized pulse laser beam L transmits through the second polarizer 342, and the polarization direction thereof is rotated by 90° at the λ/2 plate 343. Then, the pulse laser beam L, the linear polarization direction of which is aligned with a direction orthogonal to the sheet of FIG. 15 maintains the polarization direction intact when no high voltage is applied to the electrooptical crystal 340c, and thus is reflected at the first polarizer 341 and does not pass through the optical shutter 32k. When high voltage is applied to the electrooptical crystal 340c, the linear polarization direction returns to a direction parallel to the sheet as the pulse laser beam L passes through the electrooptical crystal 340c, and thus the pulse laser beam L transmits through the first polarizer 341 and passes through the optical shutter 32k. In this manner, the optical shutter 32k has the function of opening and closing depending on whether the high voltage application is performed.

When no high voltage is applied, the optical shutter 32k of the present example functions as described below on the pulse laser beam L passing through the optical shutter 32k from right to left in FIG. 15. For example, the pulse laser beam L passing through from right to left in FIG. 15 has a linearly polarized light component in a direction orthogonal to the sheet and a linearly polarized light component in a direction parallel to the sheet. Of the pulse laser beam L passing through from right to left in FIG. 15, the linearly polarized light component in the direction orthogonal to the sheet is reflected at the first polarizer 341. However, the linearly polarized light component in the direction parallel to the sheet passes through the first polarizer 341 and the electrooptical crystal 340c while maintaining the polarization direction, and is reflected at the second polarizer 342 after the polarization direction is rotated by 90° at the λ/2 plate 343. Thus, when the optical shutter 32k of the present example is employed, damage on the laser device due to self-oscillation light and return light can be reduced.

The above description is intended to provide not restriction but examples. Thus, the skilled person in the art would clearly understand that the embodiments of the present disclosure may be changed without departing from the scope of the claims.

Terms used throughout the present specification and the claims should be understood as non-limiting terms. For example, it should be understood that the terms "includes" and "included" mean that "the present invention is not limited to a subject described as being included". It should be understood that the term "has" means that "the present invention is not limited to a subject described as being had". It should be understood that the indefinite article "a" in the present specification and the claims means "at least one" or "one or more".

What is claimed is:

1. A laser device, comprising:
a plurality of optical shutters disposed in series with each other on an optical path of a laser beam and configured to open and close in response to application of high voltage;
a power source device configured to generate the high voltage to be applied to the optical shutters;
a high-voltage side wire connecting the power source device and each optical shutter;
a ground-side wire grounding each optical shutter; and
a high-voltage side shared wire and a ground-side shared wire electrically connecting the optical shutters in parallel with each other,
one of the high-voltage side wire and the ground-side wire being connected with an optical shutter disposed on a most upstream side in a traveling direction of the laser beam among the optical shutters, and
another of the high-voltage side wire and the ground-side wire being connected with an optical shutter disposed on a most downstream side in the traveling direction of the laser beam among the optical shutters.

2. The laser device according to claim 1, further comprising a delay circuit configured to receive a trigger signal instructing application of the high voltage and generate a synchronizing signal instructing the power source device to apply the high voltage a predetermined delay time after the trigger signal.

3. The laser device according to claim 2, wherein the delay circuit sets the delay time to be a time for correcting variation in timing of the high voltage application due to wiring lengths of the high-voltage side shared wire and the ground-side shared wire.

4. The laser device according to claim 1, wherein the high-voltage side shared wire and the ground-side shared wire have lengths equal to each other.

5. The laser device according to claim 1, wherein the optical shutters include at least three optical shutters, and a plurality of the high-voltage side shared wires and a plurality of the ground-side shared wires connecting the optical shutters are provided.

6. The laser device according to claim 5, wherein the high-voltage side shared wires have lengths equal to each other.

7. The laser device according to claim 5, wherein the high-voltage side shared wires have such lengths that a timing at which the laser beam is incident on each of the at least three optical shutters coincides with the timing of the high voltage application to the optical shutter on which the laser beam is incident.

8. The laser device according to claim 5, wherein the ground-side shared wires have lengths equal to each other.

9. The laser device according to claim 1, wherein the power source device includes a high voltage source, and a switch circuit configured to control application of high voltage generated by the high voltage source to each optical shutter.

10. The laser device according to claim 1, wherein each optical shutter includes an EO pockels cell.

11. The laser device according to claim 1, further comprising a master oscillator configured to emit the laser beam, and an amplifier configured to amplify the laser beam emitted by the master oscillator.

12. The laser device according to claim 11, wherein each optical shutter is disposed on a downstream side of the master oscillator and the amplifier in the traveling direction of the laser beam.

13. The laser device according to claim 11, comprising a plurality of the amplifiers, wherein
the optical shutters are provided on a downstream side of the respective amplifiers in the traveling direction of the laser beam, so that the optical shutters are provided in a plurality of pairs with the respective amplifiers.

14. The laser device according to claim 1, wherein
the high-voltage side wire is connected with an optical shutter disposed on the most upstream side in the traveling direction of the laser beam among the optical shutters, and
the ground-side wire is connected with an optical shutter disposed on the most downstream side in the traveling direction of the laser beam among the optical shutters.

15. The laser device according to claim 1, wherein
the ground-side wire is connected with an optical shutter disposed on the most upstream side in the traveling direction of the laser beam among the optical shutters, and
the high-voltage side wire is connected with an optical shutter disposed on the most downstream side in the traveling direction of the laser beam among the optical shutters.

16. An extreme ultraviolet light generation device configured to generate extreme ultraviolet light by irradiating a droplet made of a target material with a laser beam, the extreme ultraviolet light generation device comprising the laser device according to claim 1 as a light source configured to emit the laser beam.

* * * * *